United States Patent
Patel et al.

[11] Patent Number: 6,034,426
[45] Date of Patent: Mar. 7, 2000

[54] TESTABLE LOW INDUCTANCE INTEGRATED CIRCUIT PACKAGE

[75] Inventors: Mukesh P. Patel, Boise, Id.; Amit P. Agrawal, Mountain View, Calif.

[73] Assignee: Hewlett-Packard Co., Palo Alto, Calif.

[21] Appl. No.: 08/961,521

[22] Filed: Oct. 30, 1997

[51] Int. Cl.[7] ................................................. H01L 23/04
[52] U.S. Cl. .......................... 257/698; 257/48; 257/692
[58] Field of Search ................................ 257/692, 778, 257/786, 48, 698; 361/777, 749; 174/261, 262, 254

[56] References Cited

U.S. PATENT DOCUMENTS

| | | | |
|---|---|---|---|
| 5,334,857 | 8/1994 | Mennitt et al. | |
| 5,378,981 | 1/1995 | Higgins, III . | |
| 5,431,332 | 7/1995 | Kirby et al. | 228/246 |
| 5,468,999 | 11/1995 | Lin et al. | 257/784 |
| 5,640,047 | 6/1997 | Nakashima | 257/738 |
| 5,640,048 | 6/1997 | Selna | 257/738 |

*Primary Examiner*—Sheila V. Clark

[57] ABSTRACT

A low inductance integrated circuit package such as a ball grid array having mounting conductors formed on a first side thereof and a die attachment region formed on second side thereof. A plurality of conductors internal to the package interconnect the mounting conductors to the die attachment region. A plurality of diagnostic contact pads are connected to the conductors and configured for ready access by a test probe. The contact pads are preferably provided at a periphery of the package.

16 Claims, 1 Drawing Sheet

TESTABLE LOW INDUCTANCE INTEGRATED CIRCUIT PACKAGE

FIELD OF THE INVENTION

The present invention relates to ball grid arrays and related low inductance packaging. More specifically, the present invention relates to probing such packaging.

BACKGROUND OF THE INVENTION

Ball grid arrays (BGA) were introduced a few years ago and typically include a platform on which an integrated circuit is mounted. Conductive traces in the platform connect the integrated circuit to low inductance conductive balls or bumps on the underside of the platform. U.S. patents that are representative of the state of the ball grid array art include U.S. Pat. Nos. 5,045,921 (Lin, et al.), 5,216,278 (Lin, et al.), 5,468,999 (Lin, et al.) and 5,640,047 (Nakashima).

While ball grid arrays initially found acceptance, their use is apparently tapering off due to issues related to product testing. In today's high through-put electronics assembly and manufacturing facilities, it is necessary that assembled and sub-assembled products be readily testable to determine the source of a problem.

Ball grid arrays are used in high frequency, small scale environments where size constraints and issues related to electromagnetic interference (EMI) and radio frequency interference (RFI) create testing problems. It is difficult to find sufficient space for attachment of a probe head to a printed circuit board near a ball grid array. When this is achieved, the test equipment and printed circuit board traces act as radiating antennas introducing unacceptable EMI/RFI.

Hence, there is no effective way to probe ball grid array packages and the like and this has led to their use for some products being disfavored.

SUMMARY OF THE INVENTION

Accordingly, it is an object of the present invention to provide a low inductance integrated circuit package that provides ready access for testing equipment.

It is another object of the present invention to provide a low inductance integrated circuit package that permits ready attachment of probing equipment in a manner that does not create unacceptable EMI/RFI levels.

It is another object of the present invention to provide a testable low inductance integrated circuit package that is economical to manufacture and install.

It is also an object of the present invention to provide a low inductance integrated circuit package that has test equipment contact conductors distributed on a generally accessible surface thereof.

These and related objects of the present invention are achieved by use of a testable low inductance integrated circuit package as described herein.

In one embodiment, the present invention includes a platform having a plurality of low inductance mounting conductors formed on a first side thereof; an integrated circuit attachment region formed on a second side of said platform; a plurality of conductive members provided at said integrated circuit attachment region for receiving the input/output pads of an integrated circuit mounted at said integrated circuit attachment region; a plurality of conductors electrically coupling said conductive members to said mounting conductors; and a plurality of diagnostic contact pads, each electrically coupled to at least one of said conductors and configured on said platform in such manner as to facilitate ready access by a diagnostic test probe. The contact pads may be formed on the second side or on another side or both. The contact pads are preferably provided at a periphery of the platform.

In another embodiment, the present invention includes a platform having a plurality of low inductance conductive balls formed on a first side thereof; an integrated circuit attachment region formed on a second side of said platform; a plurality of conductive members provided at said integrated circuit attachment region for receiving the input/output pads of an integrated circuit mounted at said integrated circuit attachment region; a plurality of conductors electrically coupling said conductive members to said conductive balls; and a plurality of diagnostic contact pads, each electrically coupled to at least one of said conductors and configured on said platform in such manner as to facilitate ready access by a diagnostic test probe.

The attainment of the foregoing and related advantages and features of the invention should be more readily apparent to those skilled in the art, after review of the following more detailed description of the invention taken together with the drawings.

DETAILED DESCRIPTION

Figure 1:
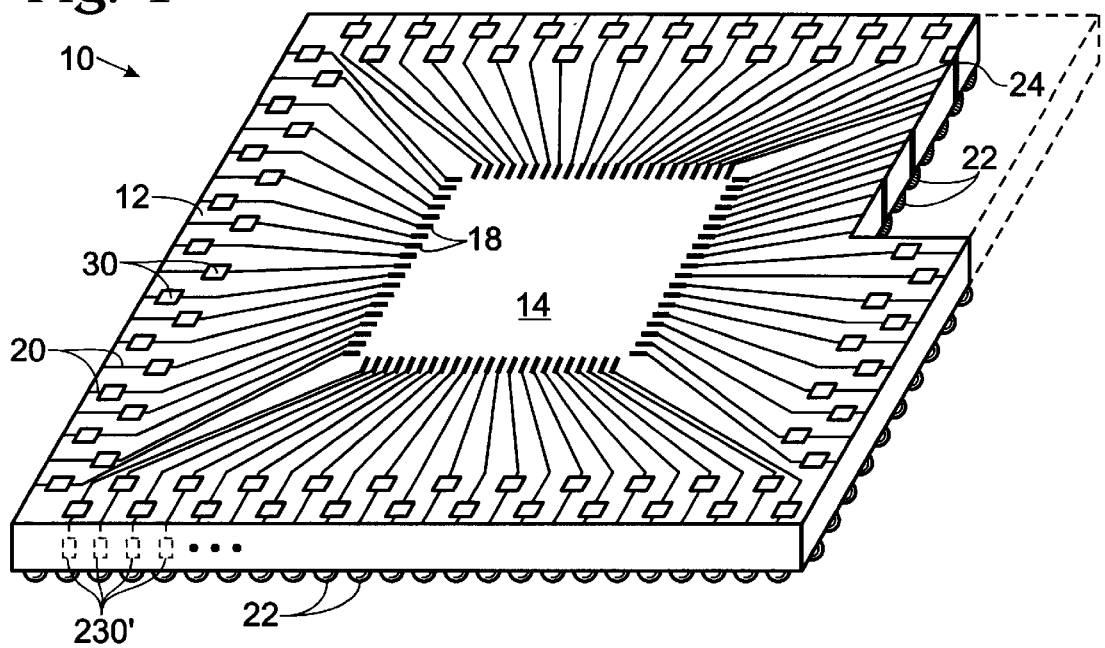
FIG. 1 is a perspective view of a ball grid array (which is an example of a low inductance integrated circuit package) in accordance with the present invention.

Referring to FIG. 1, a perspective view of a ball grid array (a low inductance integrated circuit package) in accordance with the present invention is shown. Ball grid array 10 includes a platform preferably made of a known printed circuit board or ball grid array formation material or the like. An example of a suitable material is FR4. An integrated circuit attachment region 14 is formed on platform 12, often in a central location thereof. An integrated circuit (not shown) to be packaged in ball grid array 10 is placed in attachment region 14. A plurality of conductive members 18 are provided at the edges 15 of attachment region 14. An integrated circuit is commonly flip-mounted or otherwise connected to these members which are in turn connected to signal traces 20. Signal traces 20 are preferably distributed over a top surface of platform 12. Note that the traces may be on the top surface or in a layer within ball grid array 10. Even if the conductive traces are formed on the top surface, they are usually covered with a laminate or resin for protection (though contact pads 30 are exposed at least during test).

The bottom of platform 12 has a plurality of conductive balls 22 or bumps mounted thereon. These balls are often provided along orthogonally arranged lines to form a grid, hence the name ball grid array. These balls provide low-inductance surface mounting to a printed circuit board as is known.

Conductive vias 24 interconnect signal traces 20 to balls 22 (a few of these interconnections are shown in a cut-away section of platform 12). In this manner, ball grid array 10 disperses the input/output pads of an integrated circuit though conductive members 18 to conductive balls 22 and facilitates ready connection to a printed circuit board.

It should be recognized that the rendering of a cross-section of ball grid array 10 (as shown in FIG. 1) is to illustrate conductive vias and there may be other features such as ground planes, multiple conductive and insulating layers, different via configurations, etc., in the platform.

In addition to being connected to a conductive ball 22, each signal trace 204 is connected to a contact pad 30. While the contact pads may be located at any convenient and appropriate location on the ball grid array, they are preferably provided at the periphery thereof. Amongst other considerations, the spacing between conductive traces is at its maximum at the periphery, thereby permitting formation of contact pads that have sufficient surface area for ready probe head attachment.

Contact pads 30 are preferably made of gold or other suitably conductive and workable material. The conductive traces and contact pads are preferably formed by standard photolithographic and related known techniques. A suitable probe head for use with the ball grid array of FIG. 1 may include gold fibers provided in an elastomer for connecting to the contact pads.

Empirical evidence has shown that placement of the contact pads on the ball grid array permits testing of an integrated circuit and a printed circuit board from a distance that is sufficiently close to the integrated circuit so as not to produce unacceptable EMI/RFI levels.

It is suspected that this ability to test ball grid arrays (as taught herein) both in stand-alone packages and as part of a printed circuit board assembly will significantly increase the use of ball grid arrays and the like by industry.

Figure 2:
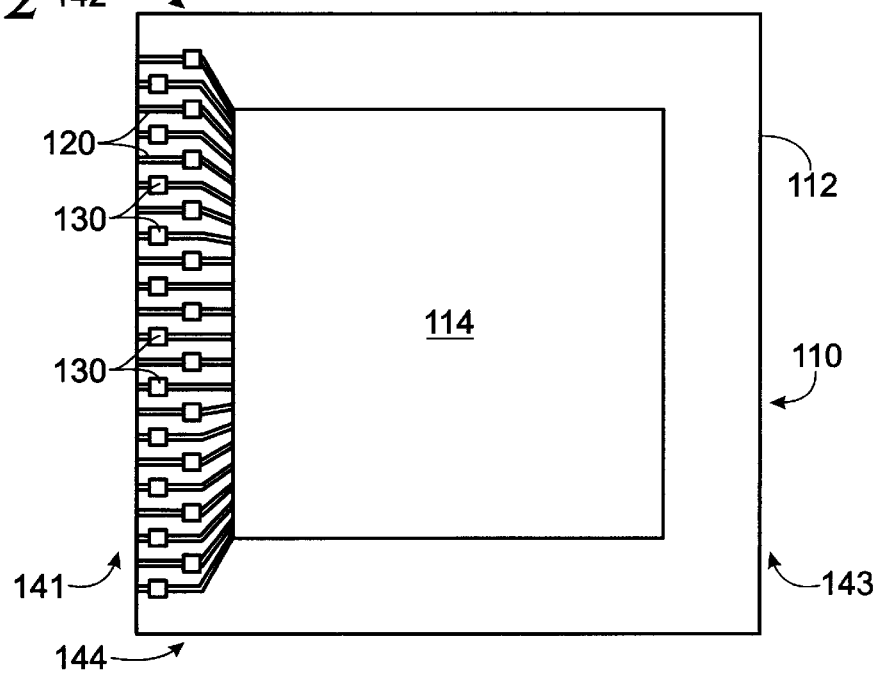
FIG. 2 is a top view of a ball grid array having representative diagnostic test contact pads distributed on one border thereof in accordance with the present invention.

Referring to FIG. 2, a top view of a ball grid array 110 having diagnostic test contact pads arranged about the periphery thereof in accordance with the present invention is shown. FIG. 2 shows conductive traces 120 coming off of a integrated circuit attachment region 114. Test probe contact pads 130 are shown coupled to the conductive traces. The balls to which traces 120 attach are on the other side of platform 112 and hence not shown from the perspective of FIG. 2. The arrangement of conductive traces 120 and contact pads 130 is shown along one border 141 of the ball grid array. This border is intended to be illustrative of similar conductive trace and contact pad arrangements for borders 142–144 (for which traces and contact pads are not shown).

Figure 3:
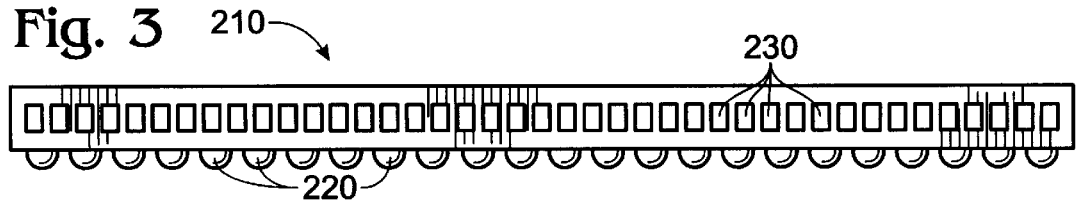
FIG. 3 is a side view of an alternative embodiment of a ball grid array in accordance with the present invention.

Referring to FIG. 3, a side view of an alternative embodiment of a ball grid array 210 in accordance with the present invention is shown. In FIG. 3, contact pads 230 are provided on the outer side wall of ball grid array 210. Amongst other considerations, formation of the contact pads on the sides reduces the likelihood that the overall size of the ball grid array will be increase. For example, in some instances, the provision of contact pads on the top surface of ball grid array 10 may necessitate formation of a ball grid array that is slightly larger in horizontal surface area to accommodate these contact pads than it would be if contact pads were not required. The embodiment of FIG. 3 also takes advantage of the fact that current ball grid array formation techniques create conductive traces that extend to the outside edge of the ball grid array platform. It should also be recognized that a ball grid array could have contact pads on both the top surface and the side walls. This embodiment is represented by the inclusion of side wall contact pads 230' shown in dashed lines in FIG. 1.

Side wall contact pads 230 may be fabricated in the same manner that conductive vias are fabricated. They may connect to conductors within the platform via internal connection or by direct connection to the surface conductive traces as shown in dashed lines in FIG. 1.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

We claim:

1. A low inductance integrated circuit package, comprising:

an excised platform having a plurality of low inductance mounting conductors formed substantially in a grid pattern on a first side thereof;

an integrated circuit (IC) attachment region formed on a second side of said platform;

a plurality of conductive IC receiving pads provided about a periphery of said IC attachment region for receiving the input/output pads of an integrated circuit mounted at said integrated circuit attachment region;

a plurality of signal traces formed on said platform substantially on said second side and extending from said IC attachment region towards a periphery of said platform;

a plurality of conductive vias, each coupled at least in part between one of said signal traces and one of said mounting conductors, to form a plurality of operational signal paths each from one of said receiving pads to one of said mounting conductors, each of said operational signal paths traversing said platform; and a plurality of permanent diagnostic test pads, each electrically coupled to at least one of said signal traces, said diagnostic test pads being configured on said platform in such manner as to be readily accessible by a diagnostic test probe;

wherein substantially all of said operational signal paths have one of said diagnostic test pads coupled thereto, thereby permitting a comprehensive testing of an integrated circuit mounted at said integrated circuit attachment region.

2. The integrated circuit package of claim 1, wherein said test pads are provided generally at a periphery of said platform.

3. The integrated circuit package of claim 1, wherein said test pads are provided on said second side of said platform and said second side is disposed substantially opposite of said first side.

4. The integrated circuit package of claim 1, wherein said second side is generally opposite said first side and at least some of said test pads are provided on a third side of said platform that is generally perpendicular to said first and second sides.

5. The integrated circuit package of claim 1, wherein said low inductance mounting conductors are conductive balls.

6. A ball grid array package, comprising:

a platform having a plurality of low inductance conductive balls formed substantially in a grid pattern on a first side thereof;

an integrated circuit attachment region formed on a second side of said platform generally opposite said first side;

a plurality of conductive receiving pads provided about a periphery of said integrated circuit attachment region for receiving the input/output pads of an integrated circuit mounted at said integrated circuit attachment region;

a plurality of first signal traces provided at least in part as vias within said platform, said first signal traces electrically coupling said receiving pads to said conductive balls and thereby forming operational signal paths between said receiving pads and said conductive balls;

a plurality of permanent diagnostic test pads provided on said platform and configured for ready access by a diagnostic test probe; and a plurality of second signal traces, each extending from one of said first signal traces to one of said test pads such that a diagnostic test probe can electrically access the first signal traces when coupled to said test pads;

wherein substantially all of said first signal traces have one of said diagnostic test pads coupled thereto, thereby permitting a comprehensive testing of an integrated circuit mounted at said integrated circuit attachment region.

7. The ball grid array package of claim 6, wherein said contact pads are provided generally at a periphery of said platform.

8. The ball grid array package of claim 6, wherein said test pads are provided on said second side of said platform.

9. The ball grid array package of claim 6, wherein said test pads are provided on a third side of said platform out of plane with said second side.

10. The ball grid array package of claim 6, wherein said first signal traces are configured to propagate device operation signals for an integrated circuit mounted at said integrated circuit attachment region.

11. The integrated circuit package of claim 4, wherein said contact pads on said third side are formed such that they extend less than the entire height of said third side.

12. A ball grid array package, comprising:

a platform having a plurality of low inductance conductive balls formed on a first surface thereof, said conductive balls being arranged substantially in a grid pattern and covering approximately at least one half of the surface area of the first surface;

an integrated circuit attachment region formed on a second surface of said platform;

a plurality of conductive receiving pads provided at said integrated circuit attachment region for receiving the input/output pads of an integrated circuit mounted at said integrated circuit attachment region;

a plurality of first signal traces provided at least in part as vias in said platform, said first signal traces electrically coupling said receiving pads to said conductive balls; and a plurality of permanent diagnostic test pads, each electrically coupled to at least one of said first signal traces and configured on said platform in such manner as to facilitate ready access by a diagnostic test probe;

wherein said first signal traces are configured to propagate device operation signals through said platform to and from an integrated circuit mounted at said integrated circuit attachment region and wherein substantially all of said first signal traces have one of said diagnostic test pads coupled thereto, thereby permitting a comprehensive testing of an integrated circuit mounted at said integrated circuit attachment region.

13. The integrated circuit package of claim 12, wherein said test pads are provided generally at a periphery of said platform.

14. The integrated circuit package of claim 12, wherein said test pads are provided on said second surface of said platform and said second surface is disposed substantially opposite of said first surface.

15. The integrated circuit package of claim 12, wherein said test pads are provided on said second surface at a periphery of said platform.

16. The integrated circuit package of claim 12, wherein said second surface is generally opposite said first surface and at least some of said test pads are provided on a third surface of said platform that is generally out of plane with said first and second surfaces.

* * * * *

UNITED STATES PATENT AND TRADEMARK OFFICE
CERTIFICATE OF CORRECTION

PATENT NO. : 6,034,426
DATED : March 7, 2000
INVENTOR(S) : Mukesh P. Patel, et al Page 1 of 1

It is certified that error appears in the above-identified patent and that said Letters Patent is hereby corrected as shown below:

Column 3:
Line 10, please replace "signal trace 204" with the phrase --signal trace 24--.

In figure 1, a reference numeral 15 should point to the edges of the attachment region 14.

Signed and Sealed this

Twelfth Day of June, 2001

*Nicholas P. Godici*

*Attest:*

NICHOLAS P. GODICI
*Attesting Officer*  *Acting Director of the United States Patent and Trademark Office*